(12) United States Patent
Liu

(10) Patent No.: US 7,479,397 B2
(45) Date of Patent: Jan. 20, 2009

(54) OPTOELECTRONICS PROCESSING MODULE AND METHOD FOR MANUFACTURING THEREOF

(75) Inventor: Shuan Ta Liu, Taipei County (TW)

(73) Assignee: Gigno Technology Co, Ltd., Taipei (TW)

( * ) Notice: Subject to any disclaimer, the term of this patent is extended or adjusted under 35 U.S.C. 154(b) by 10 days.

(21) Appl. No.: 11/605,387

(22) Filed: Nov. 29, 2006

(65) Prior Publication Data

US 2007/0069317 A1    Mar. 29, 2007

Related U.S. Application Data

(62) Division of application No. 10/950,495, filed on Sep. 28, 2004, now Pat. No. 7,329,055.

(51) Int. Cl.
*H01L 21/00* (2006.01)

(52) U.S. Cl. .................. 438/26; 438/25; 438/65

(58) Field of Classification Search .............. 438/25, 438/26, 27, 64, 65, 66
See application file for complete search history.

(56) References Cited

U.S. PATENT DOCUMENTS

| | | | | |
|---|---|---|---|---|
| 5,405,809 A | * | 4/1995 | Nakamura et al. | 438/64 |
| 5,574,814 A | | 11/1996 | Noddings et al. | |
| 5,821,627 A | * | 10/1998 | Mori et al. | 257/780 |
| 6,472,247 B1 | * | 10/2002 | Andoh et al. | 438/64 |
| 7,122,390 B2 | * | 10/2006 | Kinsman | 438/26 |

* cited by examiner

*Primary Examiner*—Kevin M Picardat
(74) *Attorney, Agent, or Firm*—Birch, Stewart, Kolasch & Birch, LLP

(57) ABSTRACT

An optoelectronics processing module includes a transparent substrate and at least one optoelectronics component. One surface of the transparent substrate is formed with a plurality of first pads and a plurality of second pads. The optoelectronics component mounted on the transparent substrate has a plurality of connecting pads, which is irradiated with a laser beam and is then connected with the first pads.

10 Claims, 6 Drawing Sheets

OPTOELECTRONICS PROCESSING MODULE AND METHOD FOR MANUFACTURING THEREOF

This application is a Divisional of co-pending application Ser. No. 10/950,495, filed on Sep. 28, 2004, the entire contents of which are hereby incorporated by reference and for which priority is claimed under 35 U.S.C. § 120.

FIELD OF INVENTION

The invention relates to an optoelectronics processing module and a method for manufacturing thereof and, in particular, to an optoelectronics processing module and a method for manufacturing thereof, which can connect an optoelectronics component to a transparent substrate.

RELATED ART

In general, optoelectronics industries include the following scopes, which are optoelectronics components, optoelectronics, displays, optical inputs/outputs, optical storages, optical communications, laser and other optoelectronics applications. Herein, the optoelectronics components include light-emitting components such as light-emitting diodes, light-receiving components such as charge coupled devices (CCDs), and compound components such as photo couplers. The optical inputs/outputs are related to the products including image scanners, barcode scanners, laser printers, facsimile machines, digital video, digital cameras, and the likes. Furthermore, the trend of the recent market is to integrate the communication products and optoelectronics products. For example, the function of camera or video is installed on the mobile phone or PDA.

In view of the above-mentioned optoelectronics products, the optical input/output products, such as digital cameras or videos, include an optoelectronics processing module for picture or image signal transformation processes. As shown in FIG. 1, a conventional optoelectronics processing module 1 mainly includes a carrier 11, an optical component 12, a supporter 13, and a glass plate 14. The optical component 12 has a light-receiving area 121, and is disposed on the carrier 11 with an adhesive layer 16. A set of wires 15 is provided to connect the optical component 12 to pads 111 of the carrier 11. The supporter 13 is disposed at the periphery of the optical component 12 and is for supporting the glass plate 14. In addition, the optoelectronics processing module 1 is disposed on and is connected to a circuit substrate 9 via the connections of the internal traces 112 of the carrier 11 and traces 91 of the circuit substrate 9.

As mentioned above, when the conventional optoelectronics processing module 1 is employed in a digital camera or video, the optical component 12 can be a CCD or a CMOS (complementary metal oxide semiconductor) image sensor. The entire height h1 of this structure is the sum of the substrate height H and the height of the optoelectronics processing module 1. For the digital cameras, digital videos and the likes, since the development trend thereof is lightweight and compact, the entire height h1, including the substrate height H and the height of the optoelectronics processing module 1, is intimately related to the outline design and functions of these products. In brief, if the entire height h1 is properly decreased, the optoelectronics products can become more lightweight and compact. Furthermore, if the entire height h1 is properly decreased, the usable internal space of the optoelectronics product can be increased. It is therefore an important subjective to decrease the entire height h1 including the substrate height H and the height of the optoelectronics processing module 1.

SUMMARY OF THE INVENTION

In view of the foregoing, the invention is to provide an optoelectronics processing module, which has a simple structure and is easily manufactured so as to decrease the entire height thereof.

In addition, the invention is to provide a method for manufacturing an optoelectronics processing module, which has a simple structure and is easily manufactured so as to decrease the entire height of the optoelectronics processing module.

To achieve the above, an optoelectronics processing module of the invention includes a transparent substrate and at least one optoelectronics component. One surface of the transparent substrate is formed with a plurality of first pads and a plurality of second pads. The optoelectronics component, mounted on the transparent substrate, has a plurality of connecting pads, which is irradiated with a laser beam and is then connected with the first pads.

As mentioned above, since the optoelectronics processing module of the invention has the optoelectronics component on the transparent substrate, the height of the optoelectronics processing module is approximately equal to the sum of the height of the transparent substrate and the height of the optoelectronics component. Comparing with the conventional optoelectronics processing module, the height of the optoelectronics processing module of the invention is greatly decreased. In particular, since the optoelectronics processing module of the invention utilizes the flip-chip technology, the optoelectronics component of the optoelectronics processing module of the invention can be accommodated in an opening of a circuit substrate when connecting the optoelectronics processing module to the circuit substrate. Therefore, the entire height of this structure can be sufficiently decreased.

In addition, the method for manufacturing an optoelectronics processing module of the invention includes the following steps of: bonding an optoelectronics component to a transparent substrate, wherein connecting pads of the optoelectronics component are respectively aligned to first pads of the transparent substrate; and illuminating a laser beam from a side of the transparent substrate to irradiate the connecting pads and the first pads so as to connect the connecting pads and the corresponding first pads.

As mentioned above, since the method for manufacturing the optoelectronics processing module of the invention disposes the optoelectronics component on the transparent substrate, the height of the optoelectronics processing module is approximately equal to the sum of the height of the transparent substrate and the height of the optoelectronics component. Comparing with the conventional optoelectronics processing module, the height of the optoelectronics processing module manufactured according to the method of the invention is greatly decreased. In particular, since the method for manufacturing the optoelectronics processing module of the invention utilizes the flip-chip technology, the optoelectronics component of the optoelectronics processing module can be accommodated in an opening of a circuit substrate when connecting the optoelectronics processing module to the circuit substrate. Therefore, the entire height of this structure can be sufficiently decreased.

BRIEF DESCRIPTION OF THE DRAWINGS

The invention will become more fully understood from the detailed description given hereinbelow illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
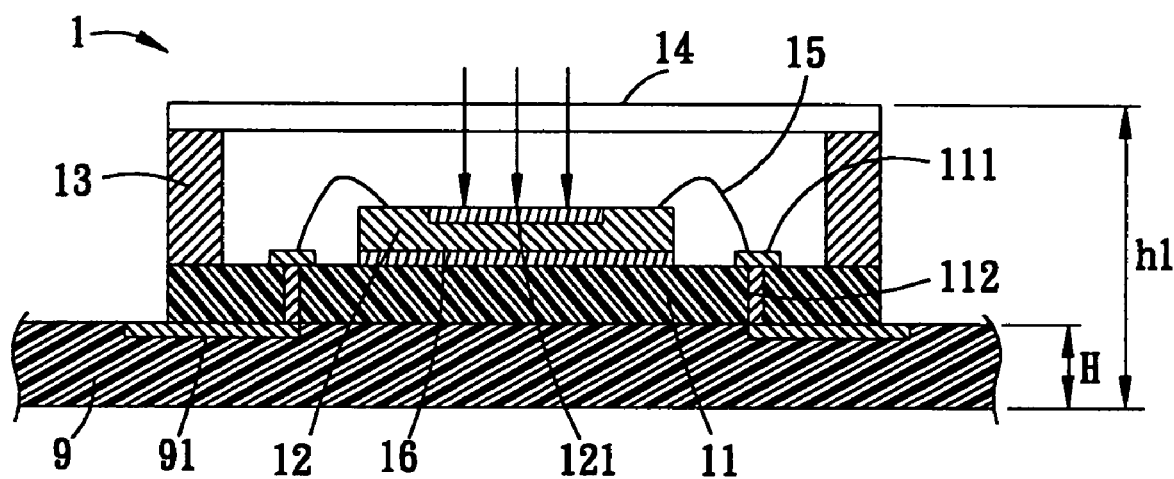
FIG. 1 is a sectional schematic view showing the conventional optoelectronics processing module.
Figure 2:
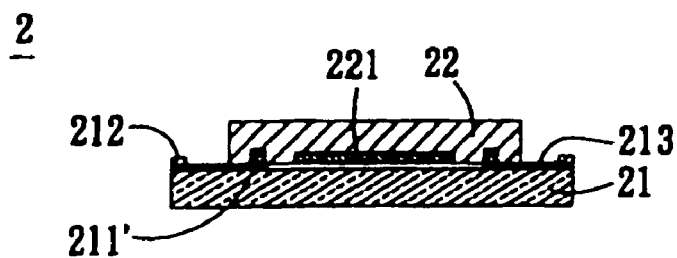
FIG. 2 is a sectional schematic view showing an optoelectronics processing module according to a preferred embodiment of the invention.
Figure 8:
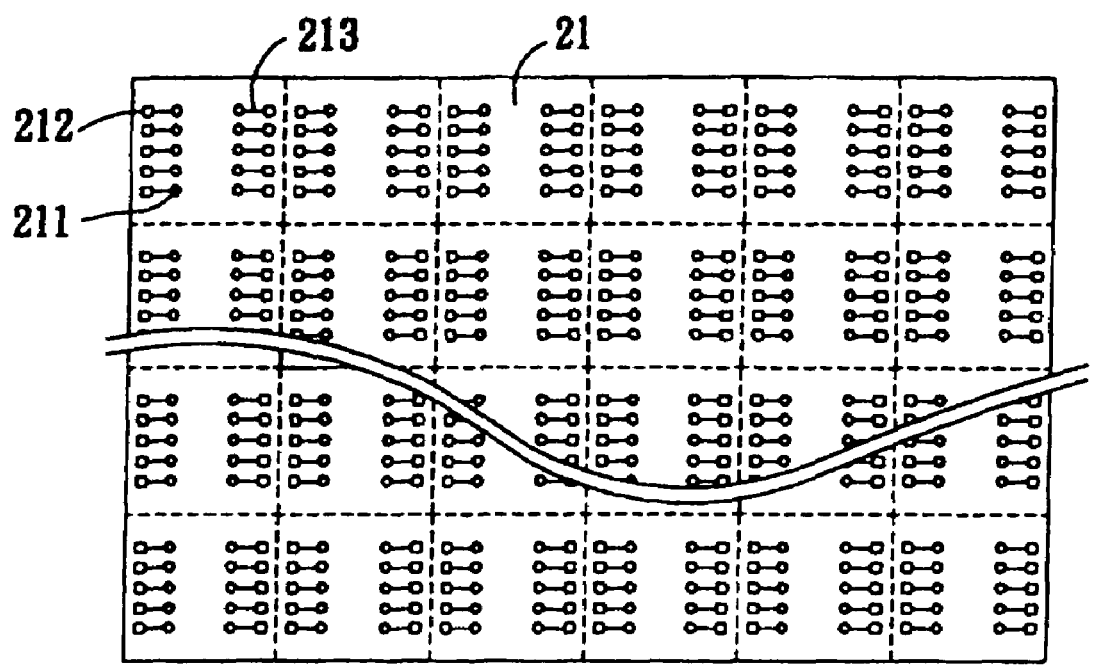
FIG. 8 is a schematic view showing a transparent substrate utilized in accordance with a method for manufacturing the optoelectronics processing modules according to a preferred embodiment of the invention.

With reference to FIG. 2, an optoelectronics processing module 2 according to a preferred embodiment of the invention includes a transparent substrate 21 and at least one optoelectronics component 22. One surface of the transparent substrate 21 is formed with a plurality of first pads 211 and a plurality of second pads 212 for external connections (as shown in FIG. 8). The first pads 211 and the second pads 212 are respectively connected to one another with the traces 213.

The optoelectronics component 22 includes a light-receiving (or light-emitting) area 221 and a plurality of connecting pads (not shown). After being irradiated by a laser beam, the connecting pads and the first pads 211 (as shown in FIG. 8) respectively connect to one another such as the reference number 211' shown in FIG. 2 or FIG. 3. Thus, the optoelectronics component 22 can be disposed on the transparent substrate 21. In the present embodiment, the optoelectronics component 22 can be a light-emitting component or a light-receiving component. The light-receiving component is, for example, a CCD or a CMOS image sensor. The transparent substrate 21 can be a glass substrate.

Figure 3:
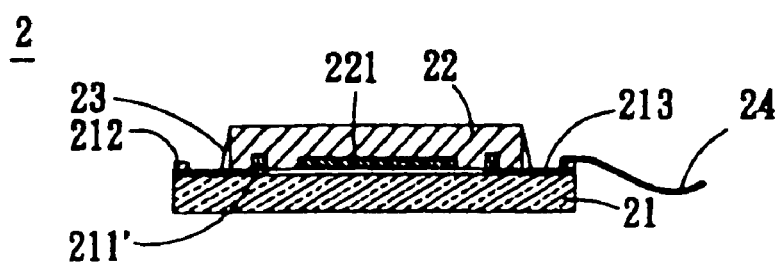
FIG. 3 is a sectional schematic view showing another optoelectronics processing module according to the preferred embodiment of the invention.

Referring to FIG. 3, the optoelectronics processing module 2 may further include a molding compound 23, which is extended from the edge of the optoelectronics component 22 to the transparent substrate 21. In addition, the optoelectronics processing module 2 may further include a flexible substrate 24, which electrically connects to the transparent substrate 21 via the second pads 212. In such a case, when installing the optoelectronics processing module 2 to an optoelectronics product, the assembling processes become more convenient.

Figure 4:
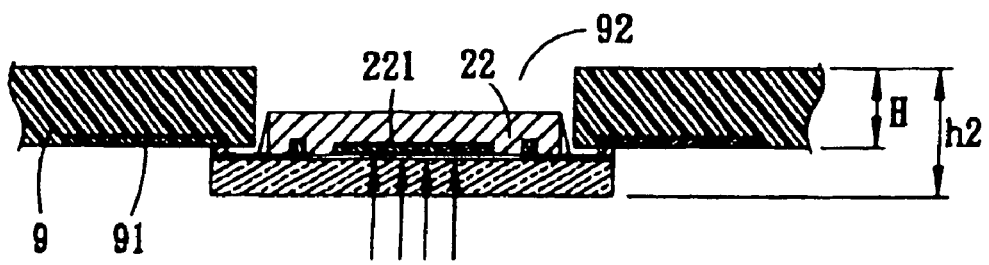
FIG. 4 is a schematic view showing the optoelectronics processing module according to a preferred embodiment of the invention disposed on a circuit substrate.

In the optoelectronics processing module 2, since the optoelectronics component 22 is disposed on the transparent substrate 21 by flip-chip technology and the transparent substrate 21 has the second pads 212, the optoelectronics processing module 2 can be disposed on a circuit substrate 9 by flip-chip technology. As shown in FIG. 4, the circuit substrate 9 includes a plurality of traces 91 and an opening 92. The optoelectronics processing module 2 electrically connects to the traces 91 via the second pads 212, and the optoelectronics component 22 is accommodated in the opening 92. With reference to FIG. 4, the optoelectronics component 22 is accommodated in the opening 92, and is disposed on the transparent substrate 21 by flip-chip technology. Therefore, assuming the height of the circuit substrate 9 is H, which is the same as that of the conventional case, the entire height h2 including the optoelectronics processing module 2 and the circuit substrate 9 of the embodiment is sufficiently smaller than the entire height h1 including the optoelectronics processing module 1 and the circuit substrate 9 as described previously.

Hereinafter, an optoelectronics processing module according to another embodiment of the invention is described with reference to FIG. 5 to FIG. 7. In concise purpose, the reference number of the same element is the same to that mentioned in the previous embodiment, and the descriptions of the same element are omitted.

Figure 5:
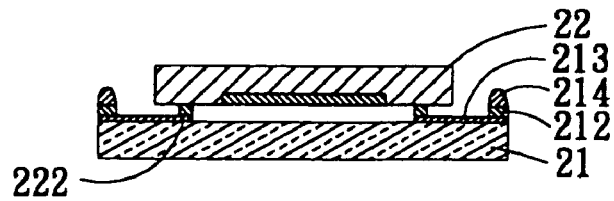
FIG. 5 is a sectional schematic view showing an optoelectronics processing module according to another preferred embodiment of the invention.

Referring to FIG. 5, to make the optoelectronics component 22 and the transparent substrate 21 be connected easier, a bump 222 can be provided on each connecting pad of the optoelectronics component 22. The bump 222 can be a solder bump or a gold bump. Of course, a bump 214, such as solder bump or gold bump, can be disposed on each second pad of the transparent substrate 21.

Figure 6:
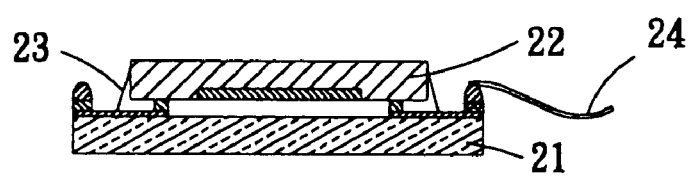
FIG. 6 is a sectional schematic view showing another optoelectronics processing module according to the another preferred embodiment of the invention.
Figure 7:
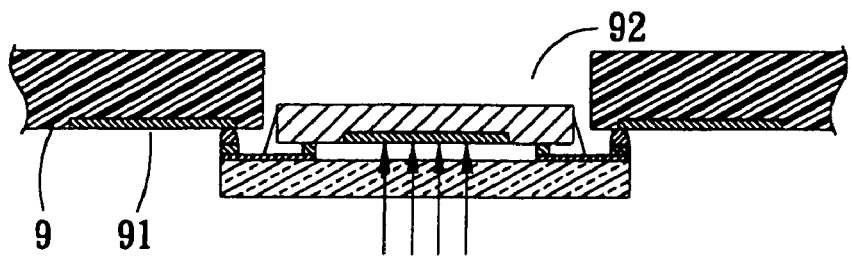
FIG. 7 is a schematic view showing the optoelectronics processing module according to a preferred embodiment of the invention disposed on a circuit substrate.

With reference to FIG. 6, the optoelectronics processing module 2 of this embodiment further includes a molding compound 23, which is disposed from the edge of the optoelectronics component 22 to the transparent substrate 21. To be noted, although the molding compound 23 is mainly for airtightly sealing the optoelectronics component 22 and the transparent substrate 21, it can has a preset hole for preventing problems caused by the air expansion and contraction between the optoelectronics component 22 and the transparent substrate 21. In addition, the optoelectronics processing module 2 of this embodiment further includes a flexible substrate 24, which is electrically connected to the transparent substrate 21 via the bump 214. As a result, when the optoelectronics processing module 2 is installed in an optoelectronics product, the assembling processes become more convenient. Furthermore, as shown in FIG. 7, when disposing the electronics processing module 2 on the circuit substrate 9, the connection between the electronics processing module 2 and the circuit substrate 9 is through the bumps 214 of the transparent substrate 21 and the traces 91 of the circuit substrate 9.

As mentioned above, since the optoelectronics processing module 2 of the invention has the optoelectronics component 22 on the transparent substrate 21, the height of the optoelectronics processing module 2 is approximately equal to the sum of the height of the transparent substrate 21 and the height of the optoelectronics component 22. Comparing with the conventional optoelectronics processing module 1, the height of the optoelectronics processing module 2 of the invention is greatly decreased. In particular, since the optoelectronics processing module 2 of the invention utilizes the flip-chip technology, the optoelectronics component 22 of the optoelectronics processing module 2 can be accommodated in an opening 92 of the circuit substrate 9 when connecting the optoelectronics processing module 2 to the circuit substrate 9. Therefore, the entire height of this structure can be sufficiently decreased. Moreover, if the optoelectronics processing module 2 of the invention includes the flexible substrate 24 such that the circuit substrate 9 is unnecessary, the entire height thereof can be further decreased.

Hereinafter, a method for manufacturing an optoelectronics processing module according to an embodiment of the invention is described with reference to FIG. 8 to FIG. 12. In concise purpose, the descriptions of the structure of the optoelectronics processing module are omitted.

The method for manufacturing an optoelectronics processing module is for connecting an optoelectronics component to a transparent substrate. Wherein, the optoelectronics component has a plurality of connecting pads, and one surface of the transparent substrate has a plurality of first pads and a plurality of second pads. The method includes the following steps of: bonding the optoelectronics component to the transparent substrate, wherein the connecting pads are respectively aligned to the first pads of the transparent substrate; and illuminating a laser beam from a side of the transparent substrate to irradiate the connecting pads and the first pads so as to connect the connecting pads and the corresponding first pads.

Figure 9:
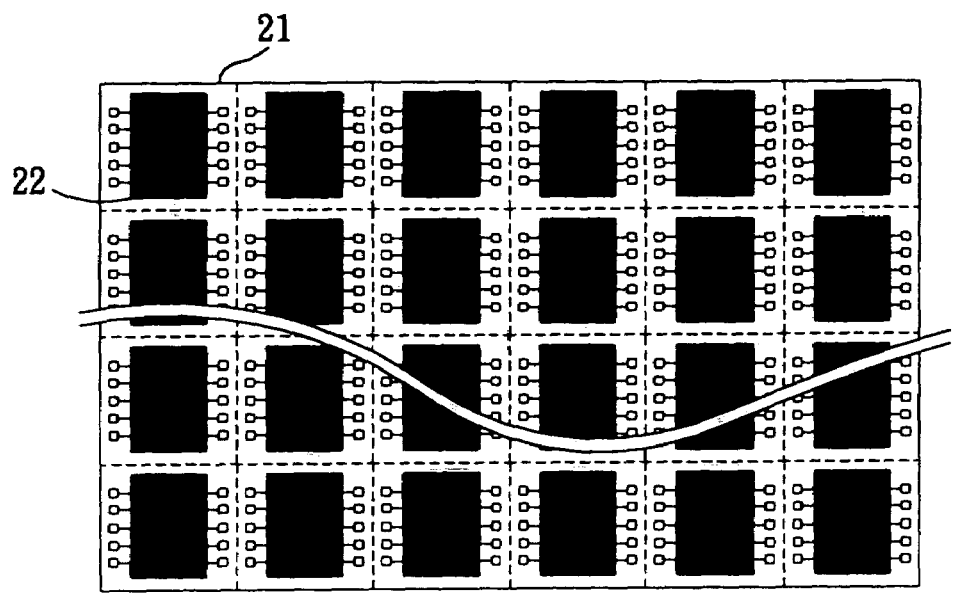
FIG. 9 is a schematic view showing the optoelectronics components bonded to the transparent substrate in accordance with the method for manufacturing the optoelectronics processing modules according to the preferred embodiment of the invention.

In practice, in order to decrease the manufacturing cost, the method of the embodiment may, in advance, provide a transparent substrate 21 (glass substrate) having a plurality of preformed optoelectronics component bonding areas. As shown in FIG. 8, each optoelectronics component bonding area of the transparent substrate 21 includes a plurality of first pads 211 and a plurality of second pads 212 formed on the surface thereof. The first pads 211 and the second pads 212 are respectively connected to each other via the traces 213. With reference to FIG. 9, a plurality of optoelectronics components 22 are sequentially attached to the transparent substrate 21 by flip-chip technology. As a result, each connecting pad of the optoelectronics component 22 is aligned to each first pad 211 of the transparent substrate 21.

Figure 10:
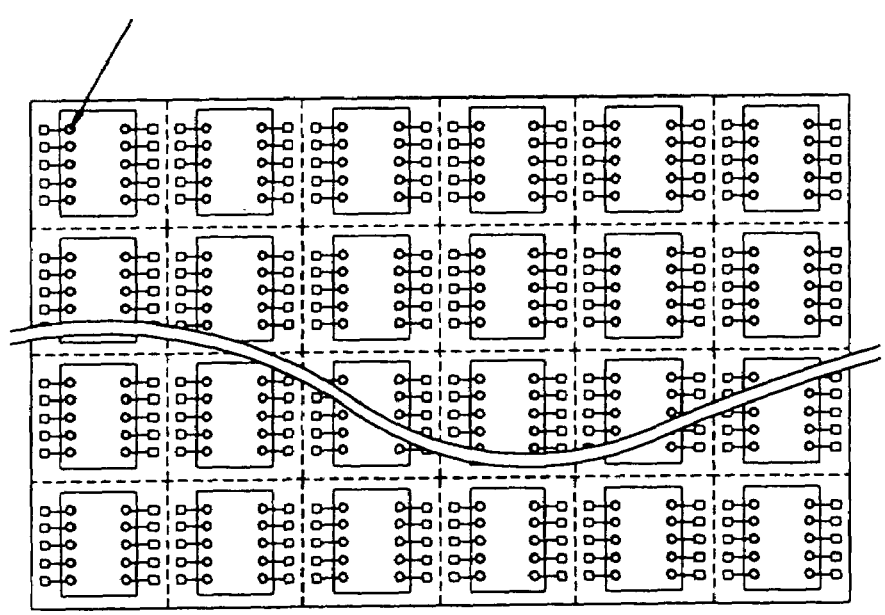
FIG. 10 is a schematic view showing a laser beam is used to connect the optoelectronics component to the transparent substrate in accordance with the method for manufacturing the optoelectronics processing modules according to the preferred embodiment of the invention.
Figure 11:
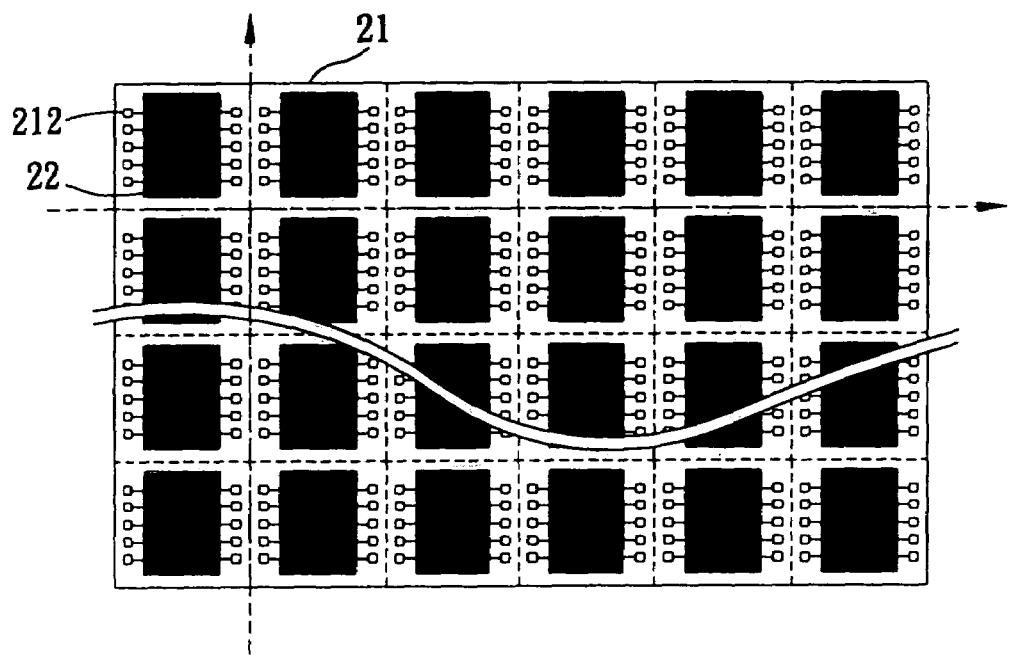
FIG. 11 is a schematic view showing cutting the transparent substrate in accordance with the method for manufacturing the optoelectronics processing modules according to the preferred embodiment of the invention.

When the optoelectronics components 22 are respectively attached to the transparent substrate 21, as shown in FIG. 10, a laser beam is illuminated from one side of the transparent substrate 21 (as the arrow) to irradiate each connecting pad and the corresponding first pad 211. Accordingly, each connecting pad and the corresponding first pad 211 can connect with each other. Finally, as shown in FIG. 11, the transparent substrate 21 is cut according to each optoelectronics component bonding area. Thus, a single optoelectronics processing module can be obtained. Certainly, a molding compound 23 can be formed at the periphery of each optoelectronics component 22 before the cutting process. The molding compound 23 is disposed from the edge of each optoelectronics component 22 to the transparent substrate 21. After the cutting process, each optoelectronics processing module 2 may further include a flexible substrate 24.

Figure 12:
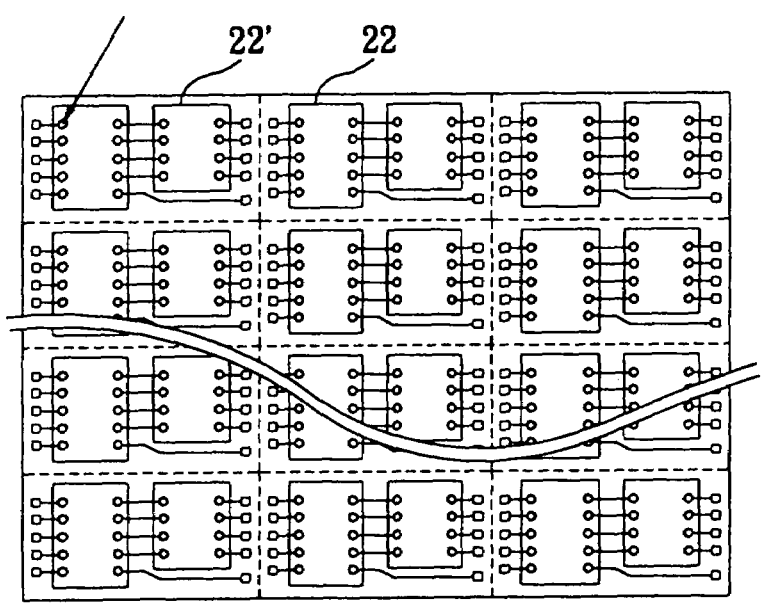
FIG. 12 is a schematic view showing another transparent substrate utilized in accordance with the method for manufacturing the optoelectronics processing modules according to the preferred embodiment of the invention, wherein a laser beam is used to connect the optoelectronics components and the transparent substrate.

In addition, as shown in FIG. 12, an optoelectronics component 22 and a semiconductor component 22' can be disposed on the optoelectronics component bonding area of the transparent substrate 21. In this case, each optoelectronics processing module 2 can equip with a system function.

As mentioned above, since the method for manufacturing the optoelectronics processing module of the invention disposes the optoelectronics component 22 on the transparent substrate 21, the height of the optoelectronics processing module 2 is approximately equal to the sum of the height of the transparent substrate 21 and the height of the optoelectronics component 22. Comparing with the conventional optoelectronics processing module 1, the height of the optoelectronics processing module 2 manufactured according to the method of the invention is greatly decreased. In particular, since the method for manufacturing the optoelectronics processing module of the invention utilizes the flip-chip technology, the optoelectronics component 22 of the optoelectronics processing module 2 can be accommodated in the opening 92 of the circuit substrate 9 when connecting the optoelectronics processing module 2 to the circuit substrate 9. Therefore, the entire height of this structure can be sufficiently decreased. Moreover, if the optoelectronics processing module 2 of the invention includes the flexible substrate 24 such that the circuit substrate 9 is not used, the entire height thereof can be further decreased.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for manufacturing an optoelectronics processing module, which is for connecting an optoelectronics component to a transparent substrate, wherein the optoelectronics component has a plurality of connecting pads and one surface of the transparent substrate has a plurality of first pads and a plurality of second pads for external connection, the method comprising:

bonding the optoelectronics component to the transparent substrate, wherein the connecting pads are respectively aligned to the first pads of the transparent substrate; and illuminating a laser beam from a side of the transparent substrate to irradiate the connecting pads and the first pads so as to connect the connecting pads and the corresponding first pads.

2. The method of claim 1, further comprising: disposing a molding compound at the edge of the optoelectronics component, wherein the molding compound is extended from the edge of the optoelectronics component to the transparent substrate.

3. The method of claim 1, further comprising: electrically connecting a flexible substrate to the transparent substrate via the second pads.

4. The method of claim 1, wherein the optoelectronics component is a light-emitting component.

5. The method of claim 1, wherein the optoelectronics component is a light-receiving component.

6. The method of claim 5, wherein the light-receiving component is a charge coupled device (CCD) or a CMOS (complementary metal oxide semiconductor) image sensor.

7. The method of claim 1, wherein a bump is disposed on one of the connecting pads of the optoelectronics component, and the bump is a solder bump or a gold bump.

8. The method of claim 1, wherein a bump is disposed on one of the first pads of the transparent substrate, and the bump is a solder bump or a gold bump.

9. The method of claim 1, wherein a bump is disposed on one of the second pads of the transparent substrate, and the bump is a solder bump or a gold bump.

10. The method of claim 1, wherein the transparent substrate is a glass substrate.

* * * * *